US008866467B1

United States Patent
Wile (10) Patent No.: US 8,866,467 B1
(45) Date of Patent: Oct. 21, 2014

(54) SYSTEMS AND METHODS TO PERFORM INTEGRATED POWER MEASUREMENT AND RDSON MEASUREMENT

(75) Inventor: Donald Wile, San Jose, CA (US)

(73) Assignee: Adaptive Digital Power, Inc., San Jose, CA (US)

( * ) Notice: Subject to any disclaimer, the term of this patent is extended or adjusted under 35 U.S.C. 154(b) by 909 days.

(21) Appl. No.: 12/889,199

(22) Filed: Sep. 23, 2010

Related U.S. Application Data (60) Provisional application No. 61/278,107, filed on Oct. 5, 2009, provisional application No. 61/278,108, filed on Oct. 5, 2009, provisional application No. 61/278,109, filed on Oct. 5, 2009, provisional application No. 61/278,127, filed on Oct. 5, 2009, provisional application No. 61/278,128, filed on Oct. 5, 2009, provisional application No. 61/278,129, filed on Oct. 5, 2009.

(51) Int. Cl.
*H02M 3/156* (2006.01)

(52) U.S. Cl.
USPC .......................................... 323/351; 702/60

(58) Field of Classification Search
USPC ......... 323/265, 266, 273, 274, 275, 276, 277, 323/344, 222, 223, 224, 280, 313–317; 363/62; 702/60, 64, 65
See application file for complete search history.

(56) References Cited

U.S. PATENT DOCUMENTS

| 6,310,469 | B1 | 10/2001 | Bentolila et al. |
|---|---|---|---|
| 6,806,690 | B2 * | 10/2004 | Xi .................................. 323/273 |
| 6,861,832 | B2 * | 3/2005 | Perez ............................ 323/316 |
| 7,061,213 | B2 | 6/2006 | Yoshida |
| 7,154,253 | B1 * | 12/2006 | Gunther ........................ 323/283 |
| 7,173,403 | B1 | 2/2007 | Chen et al. |
| 7,675,276 | B2 | 3/2010 | Ohkawa et al. |
| 2005/0057238 | A1 | 3/2005 | Yoshida |
| 2008/0130325 | A1 | 6/2008 | Ye |
| 2009/0079410 | A1 | 3/2009 | Ohkawa et al. |
| 2009/0102444 | A1 | 4/2009 | Nonaka |
| 2009/0315523 | A1 | 12/2009 | Kumagai et al. |
| 2010/0066328 | A1 | 3/2010 | Shimizu et al. |
| 2010/0102788 | A1 | 4/2010 | Kuroyabu et al. |
| 2013/0063110 | A1 * | 3/2013 | Ivanov et al. ................. 323/280 |

* cited by examiner

*Primary Examiner* — Gary L Laxton
*Assistant Examiner* — Afework Demisse
(74) *Attorney, Agent, or Firm* — Tran & Associates (57) ABSTRACT

Systems and methods are disclosed to provide a process independent circuit for measuring output current of low drop out (LDO) regulators as well as buck regulators. The system can also measure the on resistance (RDSon) of the buck power transistors.

19 Claims, 7 Drawing Sheets

SYSTEMS AND METHODS TO PERFORM INTEGRATED POWER MEASUREMENT AND RDSON MEASUREMENT

This application claims priority to U.S. Provisional Application Ser. Nos. 61/278,107; 61/278,108; 61/278,109; 61/278,127; 61/278,128; and 61/278,129, all of which were filed on Oct. 5, 2009, the contents of which are incorporated by reference.

BACKGROUND

The present invention relates to systems and methods for performing integrated power measurement and/or RDSon measurement.

The capability to dynamically measure the power consumption of an electronic system is highly desirable. Some of the benefits include: system fault detection (should power exceed a normal range), engineering power savings (during system proto type development), ability to provide accurate battery life estimates (in a battery operated system). Today's modern electronic systems often utilize switching regulators in order to improve the system power efficiency and reduce heat.

One way to perform power measurement on a particular circuit is to detect the amount of current flowing in the circuit. Previous solutions to measuring the current flow utilize a sense resistor in series with the output, wherein the voltage drop across the resistor is proportional to the output current. The current is measured by sensing this resistor voltage drop. This method works at the expense of lower efficiency, as any voltage across the sense resistor results in a power loss and resulting degradation in the regulator efficiency. Consequently, in order to minimize the power loss, the sense resistor value is kept small which results in poor resolution of low current measurements (due to the low resulting voltage drop across the sense resistor). Also, low value resistors are expensive.

Another method of measuring electric currents is through an integrator. The current is applied to the integrator, and after a period of time the value of the integrated current is examined, and the current value can be determined from the result of such examination. For example, the integrated current can be permitted to reach a predetermined value and the average current is then a function of the time taken to reach that value. Alternatively, the average current is a function of the time taken to reduce the integrated current to zero, with a reference current.

An alternate method for measuring the output current requires the use of specialized output inductors. Most switching regulators utilize external inductors as part of the voltage transformation/regulation loop. It is possible to add a separate set of "turns" around the output inductor which sense the magnitude of the magnetic flux in the inductor. The magnitude of the magnetic flux is proportional to the current in the inductor. Thus, the extra turns provide a means to sense the current flow in the output inductor. While this method does not suffer the efficiency loss of the sense resistor method, it does require the use of a more expensive and non-standard output inductor.

In a parallel trend, active switching devices such as transistors have an on-resistance (RDSon) that affects their operational characteristics. RDSon measurements are difficult to make on Automatic Test Equipment (ATE) during final production test, yet guaranteeing RDSon at final test is important to proper operation of the part. Thus, a self-test ability of the part for RDSon is highly desirable.

SUMMARY

Systems and methods are disclosed to provide a process independent circuit for measuring output current of low drop out (LDO) regulators as well as buck regulators. The system can also measure the on resistance (RDSon) of the buck power transistors.

In one aspect, a power measurement system for a low drop out (LDO) regulator includes a power transistor providing an LDO output current; and a process independent voltage generator to receive a portion of the LDO output current and to generate a process independent voltage proportional to the LDO output current, wherein the process independent voltage generator is proportional to either ratios of two or more process dependent resistors or a process independent resistor and process independent current.

Implementations of the above aspect may include one or more of the following. A proportionate amount of the LDO output current can be generated across first and second resistors which are fabricated on an integrated circuit. The voltage across each resistor varies in proportion to an LDO output current and a ratio of the resistances of the first and second resistors. A current sense transistor can be connected in series with the process dependent resistor provides a source degeneration resistance with a current $Iout=Vod*[Gm1/(1+Gm1*source\ degeneration\ resistance)]$, where Vod comprises an overdrive voltage and wherein Gm1 comprises a transconductance value of the current sense transistor. The overdrive voltage is a gate-source voltage of the power transistor less a threshold voltage of the current sense transistor. The output voltage is approximated by an overdrive voltage and a ratio of an output resistance and a source degeneration resistance. The system can include an op-amp coupled to a target voltage source at a negative terminal; a first power transistor having: a first terminal coupled to a supply voltage; a second terminal coupled to a positive terminal of the op-amp, and a gate controlled by the op-amp; a load coupled to the positive terminal of the op-amp; a current sense transistor coupled to the op-amp; and a process dependent output resistor connected to the current sense transistor; and a process dependent source degeneration resistor coupled to the current sense transistor, wherein the voltage output at the output resistor comprises a predetermined multiple of a ratio between the load resistor and the source degeneration resistor.

In another aspect, a method to perform process independent measurement of the output current of an LDO regulator includes generating a process independent voltage proportional to the LDO output current, wherein the process independent voltage generator is proportional to the ratios of two or more process dependent resistors process independent current; and determining power output of the LDO as a function of the process independent voltage and the current.

Implementations of the above method can include partially compensating for integrated circuit process variations in the measurement of the output current of a LDO regulator.

In yet another aspect, a method to perform process independent measurement of the output current of an LDO regulator by generating a process independent voltage proportional to the LDO output current, wherein the process independent voltage is proportional to a process independent resistor and process independent current; and determining power output of the LDO as a function of the process independent voltage and the current.

In another aspect, a power measurement system for a buck regulator includes an output transistor to provide a buck output current; and a sense transistor and sense resistor coupled to the output transistor to sense a portion of a buck output current without degrading the efficiency of the buck regulator.

Implementations of the above system may include one or more of the following. A filter can convert current pulses in the sense transistor and the sense resistor to a fixed voltage level proportional to the output power of the buck regulator. An operational amplifier can force a drain source voltage of the sense transistor to equal a drain source voltage of the output transistor when the output transistor is turned on. A third transistor can be connected to the operational amplifier to force the output of the operational amplifier to a voltage rail when the first power transistor is off and to reduce operational amplifier output voltage swing. One or more switches can connect the inputs of the operational amplifier across the power output transistor and the sense resistor to measure an on resistance (RDSon) of the power output transistor. Alternatively, one or more switches can connect the inputs of the operational amplifier across the power output transistor and the sense transistor to measure an on resistance (RDSon) of the power output transistor. The RDSon of the power output transistor is proportional to the voltage generated across the sense transistor or sense resistor and provided to the output resistor for measurement by Automatic Test Equipment (ATE). The ATE supplies a current and measures a voltage at the output resistor, wherein the ATE determines the power transistor on resistance as a function of the voltage, the current, and known resistance ratios. The ATE can also be connected to the buck regulator output and sinks a current from a power transistor to produce a voltage proportional to the power transistor on resistance. The system can also include first and second power transistors having a buck output at a junction between the first and second power transistors; an op-amp having a first input terminal coupled to the buck output transistor, the op-amp having a second input coupled to a feedback resistor and a feedback transistor, and an op-amp output coupled to the feedback transistor; and a power measurement resistor coupled to the feedback transistor.

Advantages of the preferred embodiments may include one or more of the following. The system supports the ability to perform integrated power measurement and RDSon measurement. The system provides a process independent technique for measurement of the output current of an LDO regulator. The system can partially compensate for integrated circuit process variations in the measurement of the output current of a LDO regulator. The system can also measure the output power of a BUCK regulator which also partially compensates for integrated circuit process variations. The system also supports a process independent circuit for measurement of the output current of a BUCK regulator. The system also facilitates the testing of the RDSon of the BUCK output power FET. The power measurement technique utilizes much of the same circuitry used for detecting an over current condition. The technique can be used for switching BUCK regulators as well as linear Low Drop Out (LDO) regulators. Both regulators have on chip power output transistors, and the instant power measurement technique is applicable to both types of regulators. Furthermore, a slight modification of this technique allows for easy measurement of the on resistance (RDSon) of the switching power FETs. This method is applicable to systems with either external power FETs or internal power FETs.

DESCRIPTION

Figure 1:
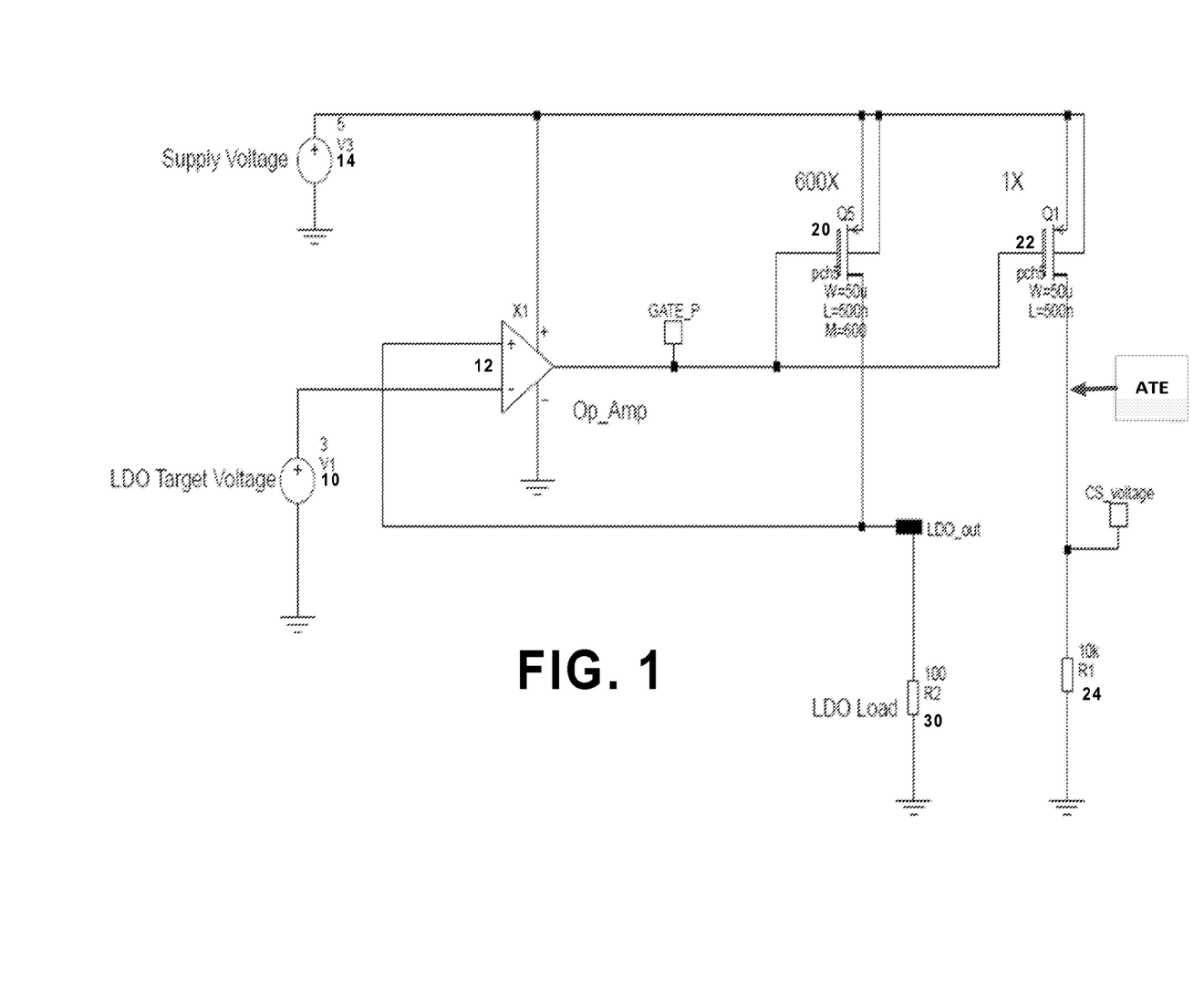
FIG. 1 shows an exemplary LDO Power Measure circuit with Current Sense.

FIG. 1 shows an exemplary LDO Power Measure circuit with Current Sense. The LDO regulator utilizes a PMOS power output transistor Q5 20, and a PMOS current sense transistor Q1 22. A supply voltage source 14 provides power to the entire circuit. The gates of Q5 20 and Q1 22 are driven by an op-amp 12. An LDO target voltage source 10 is connected to the negative input of the op amp 12, while the positive input of the op-amp 12 is connected to Q5 20 and an LDO load 30. Q1 22 is connected to a resistor 24 to generate a CS_voltage output.

Since both Q5 and Q1 always operate in a "saturated" region, the current in Q1 is a predetermined fraction of the current in Q5 (in this example the current in Q1 is 1/600 the current in Q5). The voltage at node "CS_voltage" is a measure of the power output of the LDO. The CS_voltage is directly proportional to the output current of the LDO and the power output of the LDO equals the output current multiplied by the LDO output voltage. The LDO output voltage is always known (as set by the LDO Target Voltage), thus the only un-known is the LDO output current, which the CS_voltage is proportional to. Thus a measurement of the CS_voltage allows for easy calculation of the LDO output power as given by the following equation:

$$\text{LDO output power} = (\text{LDO Target Voltage}) * [(CS\_voltage/R1) * 600] \qquad \text{EQU. 1}$$

where: R1=the value of the current sense resistor 24; and
600=the ratio between the area of the LDO output transistor (Q5 20) and the current sense transistor (Q1 22).

If the circuit shown in FIG. 1 is integrated on a monolithic piece of silicon then the LDO output power as described by EQU. 1 can be in error by the process variation of the resistor R1 24's sheet resistance. Typically the sheet resistance variation is as much as +/−20%. This means that the value of R1 24 can vary +/−20% from process run to process run. One way to avoid this process variation is to make R1 and "external" resistor which can have much less variation (+/−1% is typical). Alternately, the modification shown in FIG. 2 can be used.

Figure 2:
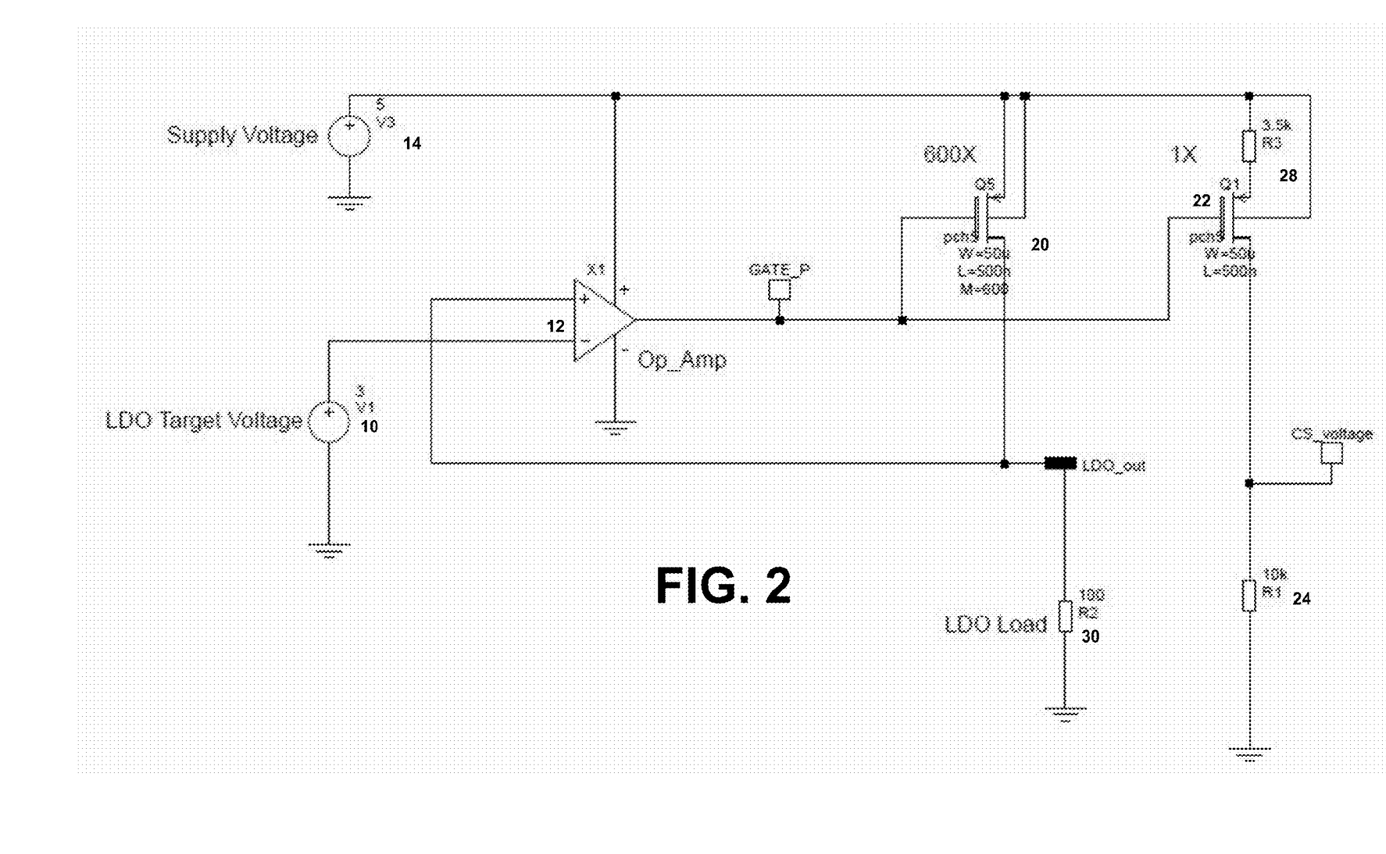
FIG. 2 shows an LDO output circuit with Modified Current Sense.

FIG. 2 shows an LDO output circuit with Modified Current Sense. The source degeneration resistor R3 28 acts to cancel out the variation in sheet resistance as can be seen by EQU. 2, 3 and 4. Equation 2 is based on AC small signal analysis but serves to illustrate the effect of R3.

$$I_{out\_Q1} = V_{od} * [Gm1/(1+Gm1*R3)] \qquad \text{EQU. 2}$$

where: Gm1=the transconductance of Q1 and
$V_{od} = V_{gate\_source\_Q5} - V_{threshold\_Q5} = $ overdrive $$CS\_voltage = R1 * I_{out\_Q1} = R1 * V_{od} * [Gm1/(1+Gm1*R3)] \qquad \text{EQU. 3}$$

and if Gm1*R3 is large compared to 1 (which it is) then:

$$CS\_voltage \sim V_{od} * [R1/R3] \qquad \text{EQU. 4}$$

EQU. 4 shows that CS_voltage now depends on the ratio of two resistors, thereby cancelling out the effect of sheet resistance variation. With the device values shown in FIG. 2, the +/−20% variation in the LDO output power calculation is reduced to approximately +/−5%. There is also a process variation with Vod but it is much smaller than the sheet resistance variation, so there is a net reduction in the process variation.

CS_voltage is proportional to the current in Q5 20, though there is now a non-linear relationship (due to the square law characteristics of the MOS FET). Regardless of the non-linearity, as long as the relationship changes little with process, an equation can be fitted (or a look up table can be used) to describe the transfer function of CS_voltage to the LDO output current. Temperature effects can also be accounted for if the chip temperature is known. Once the LDO output current is determined, knowing the LDO output voltage, the LDO output power can be calculated as:

LDO output power=(LDO output current)*(LDO output voltage)  EQU. 5

Next, BUCK Power Measure circuits are discussed. The output current detection and PM in the BUCK regulator is more difficult than the LDO as the output FET transitions in and out of its saturated region.

Figure 3:
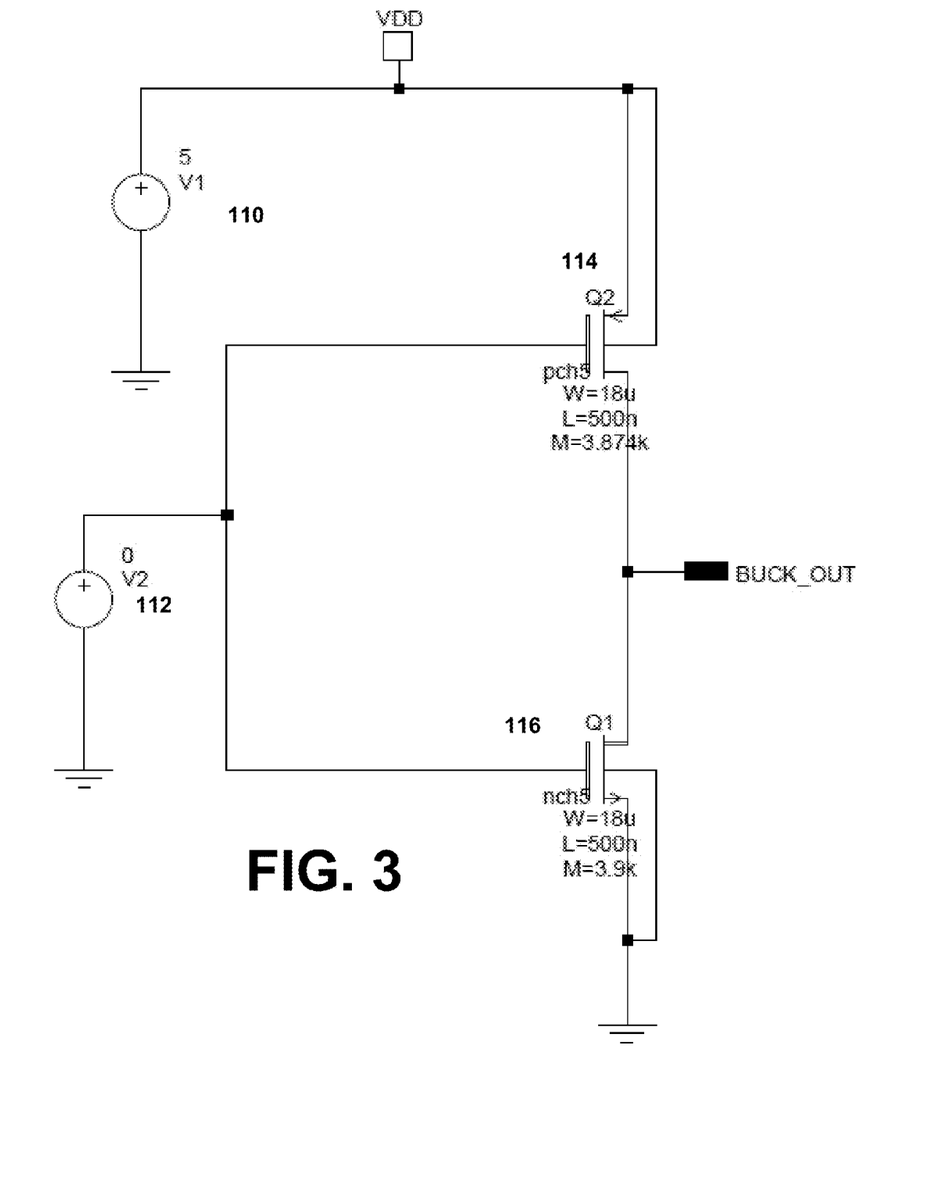
FIG. 3 shows an exemplary BUCK output stage.

FIG. 3 shows an exemplary BUCK output stage. Voltage source V1 110 supplies power to the circuit. Voltage source V2 112 drives the gates of the output transistors 114-116 with a rail to rail switching pattern that causes the output transistors Q2 114 and Q1 116 to turn on and off. When transistor Q2 114 is on, the BUCK_OUT output voltage is driven very close to the VDD power supply rail. The current in Q2 114 is determined primarily by the voltage between the drain and source, which is sufficiently small that Q2 114 is operating in its resistive region.

Figure 4:
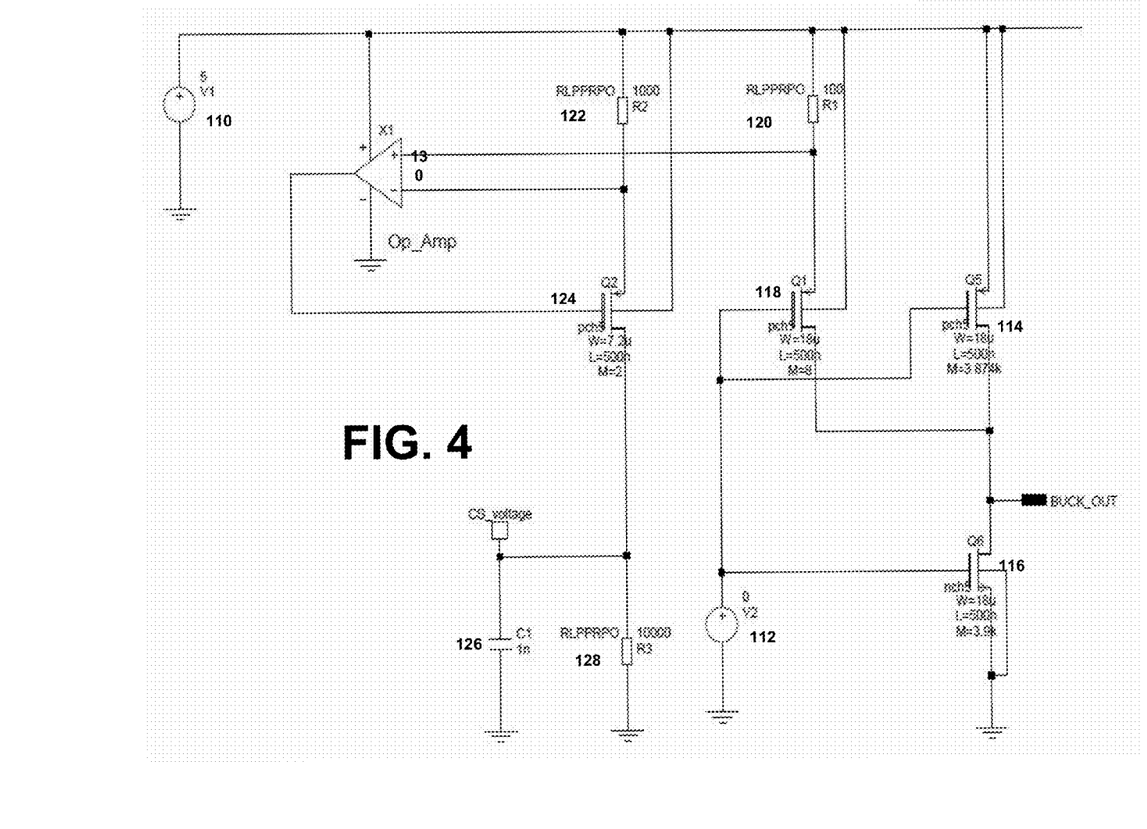
FIG. 4 shows a modified BUCK output stage which allows for detection of the current in the output FET.

FIG. 4 shows a modified BUCK output stage which allows for detection of the current in the output FET. Changes in the current in Q5 114 are reflected in the current in Q1 118 and R1 120. Operational Amplifier X1 130 forces the voltage across R2 122 to equal the voltage across R1 120 by using negative feedback. Thus, the current in R2 122 reflects a fraction of the current in Q5 114. The current in R2 122 passes through Q2 124 and creates a voltage across R3 128 which is proportional to the current in Q5 114. Since Q5 114 is switching on and off, the current in Q2 124 is in the form of pulses. C1 126 filters the pulses and provides a DC voltage at the CS_voltage which is proportional to the average current sourced by the BUCK output.

As with the LDO, if the sheet resistance of R3 128 tracks the sheet resistance of R1 120 and R2 122 then, to a first order the CS_voltage is insensitive to sheet resistance changes. Un-like the LDO, however, the voltage at CS_voltage does not need to be scaled by the filtered BUCK output voltage (i.e. the target voltage for the BUCK regulator) to determine the power supplied by the BUCK. The voltage at the CS_voltage output is directly proportional to the BUCK power. For example, assume the BUCK output is supplying a constant output current; if the output voltage of the BUCK regulator is increased (thereby increasing the output power supplied), then Q1 118 and Q5 114 will be on for a longer period of time. This increased on-time will increase the duration of the current pulses passing through Q2 124 which in turn increase the voltage at the CS_voltage. The increased CS_voltage is in direct proportion to the increase in output power supplied by the BUCK.

An alternate method for BUCK Power Measure is discussed next. Though the above method does serve to even out the effect of resistor process variations, it is still subject to process variations of the transistors. Though R3 128 can be trimmed to remove some of this variation, it is difficult to find a value of R3 128 that yields consistent results over the range of output currents. Also, this circuit shows some temperature dependence. The primary cause of these problems is the source degeneration resistor R1 which introduces a current and transconductance dependence on the ratio of current in Q5 114 to Q1 118.

Figure 5:
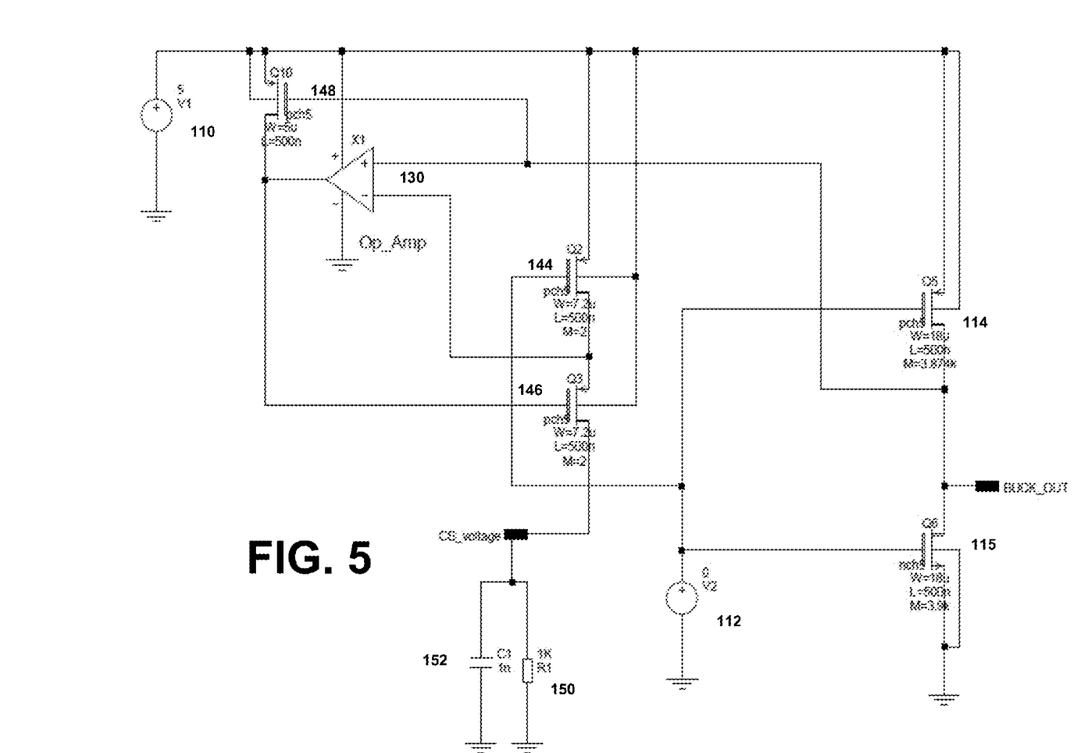
FIG. 5 shows an alternate implementation that produces a PM output that is less sensitive to process and temperature.

FIG. 5 shows an alternate implementation that produces a PM output that is less sensitive to process and temperature. In this alternate PM method, operational amplifier X1 130 forces the drain source voltage of Q2 144 to equal the drain source voltage of Q5 114 when Q5 114 is turned on. Since the gate of Q2 144 is tied to the gate of Q5 114, then the current in Q2 144 will be set by the current in Q5 114 and the ratio of the device areas, which is process independent. This is seen in equation 5.5:

$$I\_Q2 = I\_Q3 = I\_Q5 * (W/L)|_{Q2}/(W/L)|_{Q5}$$  EQU. 5.5

As there are no process or temperature dependent terms in EQU. 5.5, the CS_voltage displays no process or temperature dependence. In order for this method to work (and in the absence of Q10 148), the operational amplifier 130 must be able to slew the gate voltage of Q3 146 very quickly to keep up with the switching voltage swing at the BUCK output. This is difficult to do for a fast switching frequency. Non-ideal slewing of the operational amplifier results in errors in the CS_voltage. However, there is no need to track the drain voltage of Q2 144 with Q5 114 during the time that Q5 114 is turned off, as there is no current though Q5 114 when it is off Consequently, Q10 148 forces the output of the operational amplifier 130 to the positive supply rail when Q5 114 is off (i.e. when BUCK_OUT is low). As a result, the operational amplifier 130 only has to slew to roughly one threshold below the positive rail when Q5 114 turns back on as (opposed to slewing from ground to the one threshold below the positive rail in the absence of Q10 148). The reduced swing at the output of the operational amplifier results in faster settling time eliminating the error in the CS_voltage. The high voltage to low voltage direction of the output of the operational amplifier when Q10 148 shuts off further reduces the CS_voltage error as the current in Q2 144 goes from 0 to its operational value during this transition. Without Q10 148, Q2 144 turns on with a large drain source voltage across it (i.e. Q2 144 operates in its saturated region for a short period of time), until the operational amplifier output slews to its correct value (forcing Q2 144 into its resistive region). Thus, without Q10 148 the current in Q2 144 starts out large (due to the large drain source voltage across it) and decreases to its correct operational level . . . but the large current creates errors in the CS_voltage.

One disadvantage to the above PM method is that it does not easily allow for measurement of RDSon of Q5 114. This is because the RDSon measurement (described below) operates by copying the drain source voltage of output transistor Q5 114 across an internal resistor. The current generated from this resistor flows into R3 (FIG. 7), which in this case is an external resistor. This difference in external versus internal resistors creates a significant process variation in the CS_voltage as the internal resistor sheet resistance changes. Thus to make the RDSon measurement work, either R3 needs to be made an internal resistor (for the RDSon measurement only) or another external resistor (and associated pin) would need to be added.

The efficiency of the BUCK regulator is inversely proportional to the value of the power FET on resistances (RDSon).

Consequently a good BUCK regulator is designed with low RDSon FETs in the order of about 0.1 ohms. The measurement of the RDSon at final test (i.e. a packaged part) is highly desirable in order to guarantee the proper operation of the part. Unfortunately, measurement of this small resistance is highly problematic due to test handler contact resistance, resolution of the tester measurement, noise in the test environment and the large amount of current required for generating a useful measurement. However, with a simple modification of the BUCK PM circuit shown in FIG. 6, measurement of the RDSon is possible at final test.

Figure 6:
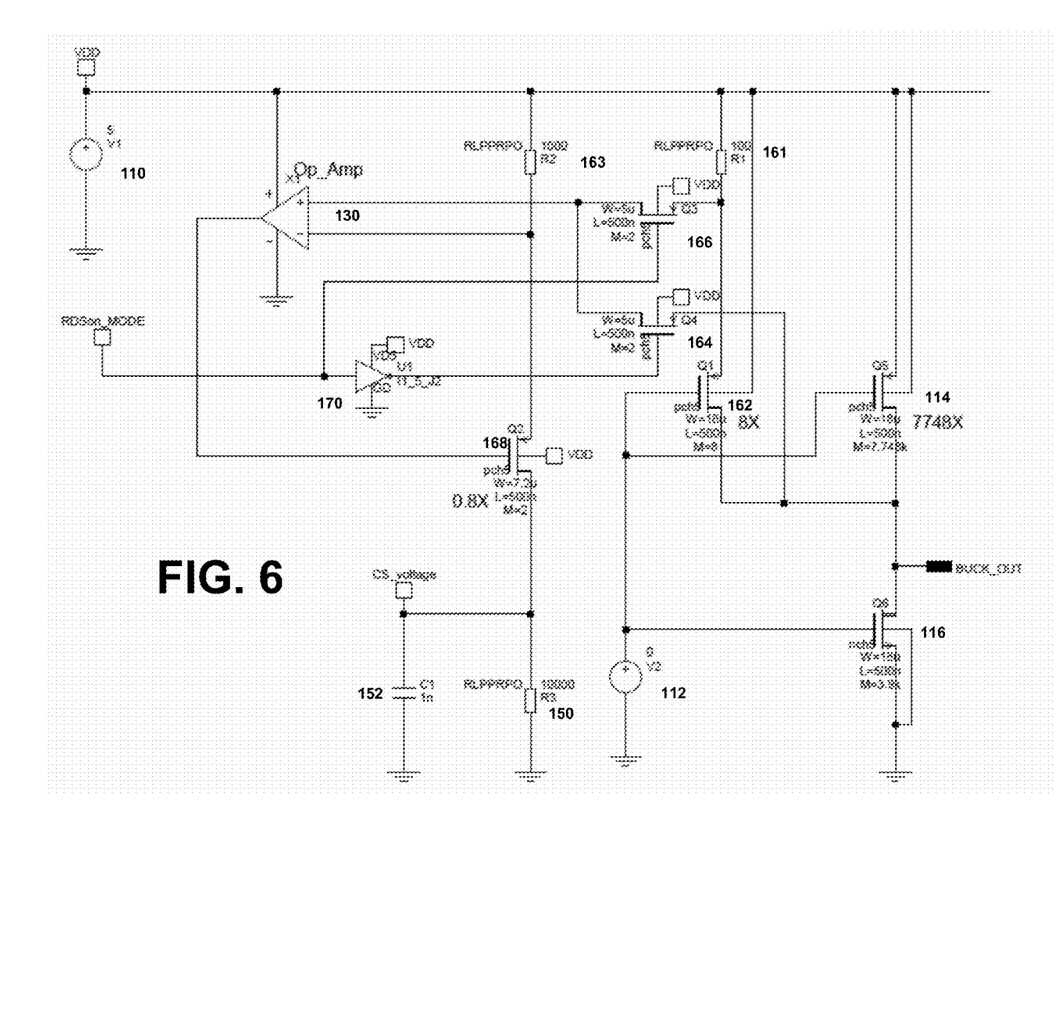
FIG. 6 shows exemplary modifications to the circuit of FIG. 5 to allow for RDSon measurements.

FIG. 6 shows exemplary modifications to the circuit of FIG. 5 to provide a BUCK Output circuit with RDSon Measurement. In this circuit, resistor R1 161 receives VDD and is connected to Q1 162. Q1 162 is connected to the BUCK_out signal. The gates of Q1 162 is connected to the voltage source V2 112. BUCK_out is also provided to Q4 164, whose output is connected to the op-amp 130 and Q3 166. A resistor R2 163 is connected to the op-amp 130 and Q2 168, which is gated by the output of op-amp 130. An inverter 170 receives RDSon MODE signal and controls the gate of Q4 164.

Switches Q3 166 and Q4 164 allow the PM circuitry to shift from measuring power (Q3 166 on and Q4 164 off) to measurement of RDSon (Q3 166 off and Q4 164 on). In RDSon measurement mode, Q5 114 is turned on continuously (note: Q5 114 is controlled by a digital controller that can be programmed to turn on Q5 114 continuously). The ATE is connected to the BUCK_OUT and sinks a predetermined amount of current, I1, from Q5 114. I1 generates a voltage, V1, across Q5 114 proportional to the RDSon of Q5 114, as show in equation 6:

$$V1 = RDSon * I1 \qquad \text{EQU. 6}$$

Operational Amplifier X1 130 forces V1 across R2 163 which generates a current I2 through Q2 168. I2 flows into R3 and produces a voltage on CS_voltage proportional to RDSon. CS_voltage is given by EQU. 7:

$$CS\_voltage = R3 * (RDSon * I1 / R2) \qquad \text{EQU. 7}$$

The unknown in EQU. 7 is RDSon. CS_voltage is measured by the ATE and I1 is sourced by the ATE. Thus RDSon is given by equation 8:

$$RDSon = CS\_voltage * (R2/R3) / I1 \qquad \text{EQU. 8}$$

As long as R3 and R2 are both integrated circuit resistors of matching material, the measured value of RDSon is independent of the process sheet resistance and only depends on the predetermined ratio of R3/R2. In one implementation, R3 is made much larger than R2 to provide gain to the CS_voltage which allows for good resolution of the measurement by the ATE.

In one example, if I1=200 ma, R2=1000 ohms, R3=10,000 ohms, and RDSon=0.1 ohms then by EQU. 7, CS_voltage= (10000)(0.1*200e-3)/1000=200 mv. An ATE might have a measurement resolution of 1 mv. This means that the 0.1 ohm RDSon measurement can be resolved down to 0.1 ohms*(1 mv/200 mv)=0.005 ohms. Once CS_voltage is known then EQU. 8 is used to calculate the RDSon value.

Alternate Method for BUCK RDSon Measurement is discussed next. The circuit shown in FIG. 5 implements an improved method (less process dependence and greater linearity) for performing power measurement with an external resistor R1. The external resistor complicates using this same circuit for making RDSon measurements.

Figure 7:
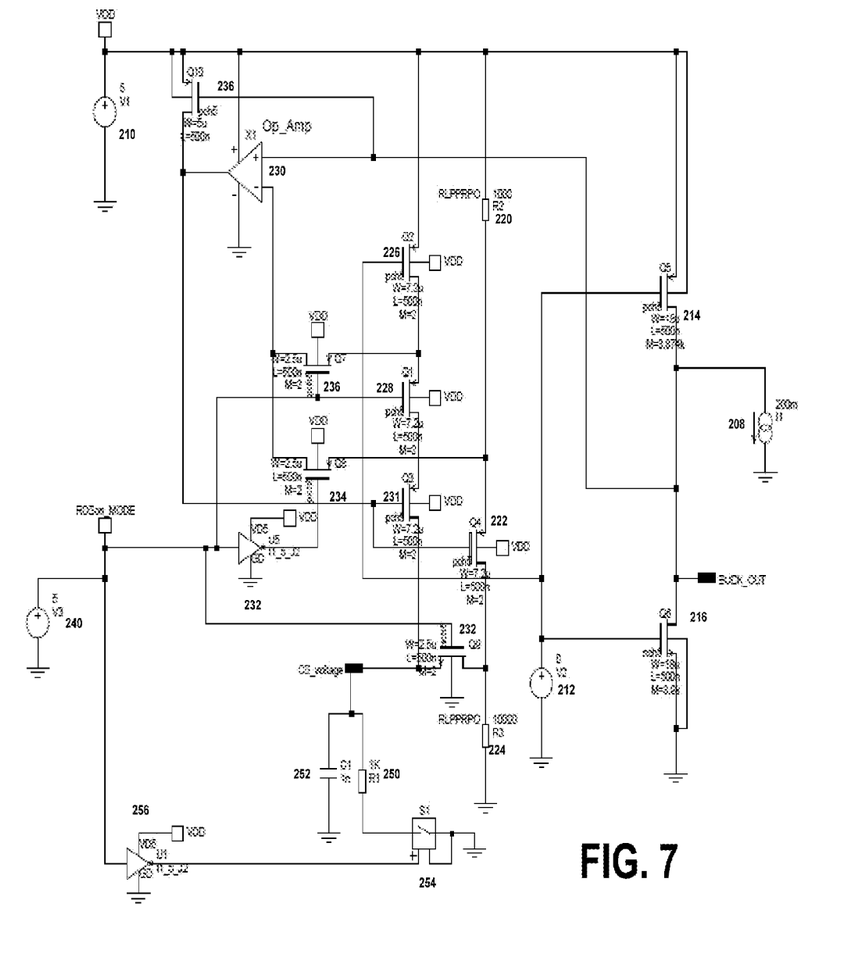
FIG. 7 shows modifications to the circuit of FIG. 5 to allow for both PM and RDSon measurements.

FIG. 7 shows modifications to the circuit of FIG. 5 to allow for both PM and RDSon measurements. In FIG. 7, voltage supply source V1 210 provides power to the entire circuit. Switch Q5 214 is connected to switch Q6 216. Voltage source V2 212 drives the gates of Q5 214 and Q6 216. Current source 208 is connected to the junction between Q5 214 and Q6 216 and to the positive input of op-amp 230. The output of op-amp 230 is connected to Q10 236, whose gate is connected to the positive input of op-amp 230. Switches Q2 226, Q1 228, Q3 231 are connected in series between VDD and switch Q9 232. Switch Q9 232 is connected to resistor R3 224 at one terminal and at the other terminal to capacitor C1 252 and resistor R1 250 in parallel. Resistor R2 220, switch Q4 222 and resistor R3 224 are connected in series between VDD and ground. The gates of switches Q3 231 and Q4 222 are driven by the output of op-amp 230.

The circuit of FIG. 7 includes voltage source V3 240 that generates the RDSon MODE signal, which is supplied to inverter U5 232 that drives the gate of switch Q8 234. RDSon MODE directly drives the gate of switch Q7 236. RDSon MODe is also provided to inverter U1 256 that controls switch S1 254.

When RDSon MODE is a logic LOW, switches Q7 236, Q1 228 and S1 254 are ON while switches Q9 232 and Q8 234 are OFF. With RDSon MODE LOW the circuit of FIG. 7 operates like the circuit shown in FIG. 5. S1 254 is an external relay located on the ATE load board. When RDSon MODE is logic HIGH, switches Q9 232 and Q8 234 are ON and Q7 236, Q1 228 and S1 254 are OFF. In this configuration, the negative input to the operational amplifier connects to one side of R2 220 which allows the operational amplifier to force the voltage across R2 220 to equal the voltage across Q5 214 (by controlling the gate voltage of Q4 222), when Q5 214 is turned on. The resulting current through R2 220 flows though Q4 222 into internal resistor R3 224 generating a voltage across R3 224 as given by EQU. 7. Because R2 and R3 are both internal resistors the ratio of R3/R2 eliminates the effect of sheet resistance variations on the calculation given by EQU. 7. When operating to measure RDSon, the external resistor R1 250 must be removed from loading the CS_voltage output. This is accomplished by opening relay S1 254.

Although the examples given above describe power measurement and RDSon measurement circuits for power supplies, one skilled in the art will appreciate that the technique can be applied to other circuit functions for operation in similar fashion. It will be understood from the foregoing description that various modifications and changes may be made in the preferred and alternative embodiments of the present invention without departing from its true spirit. For example, the FETs may be implemented using MOS transistors, bipolar transistors, or other suitable switching devices, the circuit may include a subset or superset of the elements described in the examples above, the method may be performed in a different sequence, the components provided may be integrated or separate, the devices included herein may be manually and/or automatically activated to perform the desired operation. Different device sizes and resistor values might be used.

This description is intended for purposes of illustration only and should not be construed in a limiting sense. The scope of this invention should be determined only by the language of the claims that follow. The term "comprising" within the claims is intended to mean "including at least" such that the recited listing of elements in a claim are an open group. "A," "an" and other singular terms are intended to include the plural forms thereof unless specifically excluded.

What is claimed is:

1. A power measurement system for a buck regulator, comprising:

a. an output transistor to provide a buck output current of the buck regulator; and b. a sense transistor and sense resistor coupled to the output transistor to sense a portion of the buck output current without degrading the efficiency of the buck regulator, wherein an output voltage is a measure of power output and directly proportional to an output current of the buck regulator and a power output of the buck regulator equals the output current multiplied by the output voltage, wherein a voltage V1 is proportional to a power transistor on resistance RDSon and produces a voltage CS_voltage proportional to RDSon as $$RDSon=CS\_voltage*(R2/R3)/I1$$

where a test equipment generates a current I1 and R2 and R3 are integrated circuit resistances of matching material and R3 is larger than R2.

2. The system of claim 1, comprising a filter to convert current pulses in the sense transistor and the sense resistor to a fixed voltage level proportional to the output power of the buck regulator.

3. The system of claim 1, comprising an operational amplifier to force a drain source voltage of the sense transistor to equal a drain source voltage of the output transistor when the output transistor is turned on.

4. The system of claim 3, comprising a third transistor coupled to the operational amplifier to force an output of the operational amplifier to a voltage rail when the first power transistor is off and to reduce operational amplifier output voltage swing.

5. The system of claim 3, comprising one or more switches to connect an input of the operational amplifier across a power output transistor and the sense resistor to measure an on resistance (RDSon) of the power output transistor.

6. The system of claim 3, comprising one or more switches to connect inputs of the operational amplifier across the power output transistor and the sense transistor to measure an on resistance (RDSon) of the power output transistor.

7. The system of claim 6, wherein the RDSon of the power output transistor is proportional to a voltage generated across the sense transistor or sense resistor and provided to an output resistor for measurement by Automatic Test Equipment (ATE).

8. The system of claim 7, wherein the ATE supplies a current and measures a voltage at an output resistor, wherein the ATE determines the power transistor on resistance as a function of voltage, current, and known resistance ratios.

9. The system of claim 7, wherein the ATE is connected to a buck regulator output and sinks a current from a power transistor to produce a voltage proportional to the power transistor on resistance.

10. The system of claim 1, comprising a. first and second power transistors having a buck output at a junction between the first and second power transistors;

b. an op-amp having a first input terminal coupled to the buck output transistor, the op-amp having a second input coupled to a feedback resistor and a feedback transistor, and an op-amp output coupled to the feedback transistor; and c. a power measurement resistor coupled to the feedback transistor.

11. The system of claim 1, wherein the output power equals a target Voltage*(output voltage/current sense resistance)*a ratio between an area of the output transistor and a current sense transistor.

12. The system of claim 1, comprising a source degeneration resistor to cancel sheet resistance variation.

13. The system of claim 1, wherein a voltage developed across a source degeneration resistor is proportional a known current through the output transistor times the RDSon of the output transistor.

14. The system of claim 1, wherein a current though a source degeneration resistor is fed to a similarly constructed output resistor, such that a voltage across the output resistor is then proportional to known input current through the output transistor times the-RDSon of the output transistor.

15. A system, comprising:

an Automatic Test Equipment (ATE) to test a buck regulator;

an output transistor to provide a buck output current of the buck regulator; and a sense transistor and sense resistor coupled to the output transistor to sense a portion of a buck output current without degrading the efficiency of the buck regulator;

one or more switches to connect an input of the operational amplifier across a power output transistor and the sense transistor to measure an on resistance (RDSon) of the power output transistor, wherein the RDSon of the power output transistor is proportional to voltage generated across a sense transistor or sense resistor and provided to an output resistor for measurement by the ATE, wherein a voltage V1 is proportional to RDSon and produces a voltage CS_voltage proportional to RDSon as $$RDSon=CS\_voltage*(R2/R3)/I1$$

where the ATE generates a current I1 and R2 and R3 are integrated circuit resistances of matching material and R3 is larger than R2.

16. The system of claim 15, comprising a filter to convert current pulses in the sense transistor and the sense resistor to a fixed voltage level proportional to an output power of the buck regulator.

17. The system of claim 15, comprising an operational amplifier to force a drain source voltage of the sense transistor to equal a drain source voltage of an output transistor when the output transistor is turned on.

18. The system of claim 17, comprising a transistor coupled to the operational amplifier to force an output of the operational amplifier to a voltage rail when the first power transistor is off and to reduce operational amplifier output voltage swing.

19. The system of claim 15, comprising a source degeneration resistor to cancel sheet resistance variation.

* * * * *